United States Patent
Kim et al.

(10) Patent No.: US 9,343,236 B2
(45) Date of Patent: May 17, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si (KR)

(72) Inventors: Dong Gun Kim, Suwon-Si (KR); Jae Yeol Choi, Suwon-Si (KR); Se Hwan Bong, Suwon-Si (KR); Young Ha Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 90 days.

(21) Appl. No.: 14/490,482

(22) Filed: Sep. 18, 2014

(65) Prior Publication Data

US 2015/0348711 A1  Dec. 3, 2015

(30) Foreign Application Priority Data

May 28, 2014  (KR) .......................... 10-2014-0064328

(51) Int. Cl.
*H01G 4/30* (2006.01)
*H05K 1/11* (2006.01)
(Continued)

(52) U.S. Cl.
CPC .................. *H01G 4/30* (2013.01); *H01G 4/012* (2013.01); *H01G 4/12* (2013.01); *H01G 4/248* (2013.01); *H05K 1/111* (2013.01); *H05K 1/181* (2013.01)

(58) Field of Classification Search
CPC ........... H01G 4/30; H01G 4/012; H01G 4/12; H01G 4/248; H05K 1/181; H05K 1/111

USPC .................................... 174/260; 361/301.4
See application file for complete search history.

(56) References Cited

U.S. PATENT DOCUMENTS

2008/0310078 A1  12/2008 Lee et al.
2011/0056735 A1   3/2011 Lee et al.
(Continued)

FOREIGN PATENT DOCUMENTS

JP  2013-004569 A  1/2013
JP  2013-008842 A  1/2013
(Continued)

OTHER PUBLICATIONS

Korean Office Action dated Oct. 12, 2015 issued in Korean Patent Application No. 10-2014-0064328 (English translation).

*Primary Examiner* — Timothy Thompson
*Assistant Examiner* — Charles Pizzuto
(74) *Attorney, Agent, or Firm* — McDermott Will & Emery LLP

(57) ABSTRACT

A multilayer ceramic capacitor may include: a ceramic body; a first internal electrode is spaced apart from first and second end surfaces by a predetermined distance and includes first and second lead portions which are spaced apart from each other and exposed to a first main surface; and a second internal electrode is spaced apart from the first and second end surfaces by a predetermined distance and includes a third lead portion positioned between the first and second lead portions and exposed to the first main surface. The ceramic body may further include first and second dummy electrodes, a first dummy electrode being disposed on a dielectric layer on which the first internal electrode is disposed, and a second dummy electrode being disposed on a dielectric layer on which the second internal electrode is disposed.

18 Claims, 11 Drawing Sheets

(51) Int. Cl.
*H01G 4/248* (2006.01)
*H05K 1/18* (2006.01)
*H01G 4/012* (2006.01)
*H01G 4/12* (2006.01)

(56) References Cited

U.S. PATENT DOCUMENTS

2012/0314338 A1 12/2012 Togashi
2014/0160619 A1* 6/2014 Kim .................... H01G 4/30
 361/301.4
2014/0368967 A1* 12/2014 Ahn .................... H01G 4/30
 361/301.4

FOREIGN PATENT DOCUMENTS

| | | |
|---|---|---|
| KR | 10-2008-0110180 A | 12/2008 |
| KR | 10-2011-0027321 A | 3/2011 |
| KR | 10-2014-0038911 A | 3/2014 |

* cited by examiner

MULTILAYER CERAMIC CAPACITOR AND BOARD HAVING THE SAME MOUNTED THEREON

CROSS-REFERENCE TO RELATED APPLICATION

This application claims the benefit of Korean Patent Application No. 10-2014-0064328 filed on May 28, 2014, with the Korean Intellectual Property Office, the disclosure of which is incorporated herein by reference.

BACKGROUND

The present disclosure relates to a multilayer ceramic capacitor and a board having the same mounted thereon.

In a case in which equivalent series inductance (ESL) in a multilayer ceramic capacitor is increased, electronic product performance may deteriorate. Further, as electronic components with high capacitance have been miniaturized, the degree of deterioration in electronic product performance due to an increase in ESL has relatively increased.

A multilayer ceramic capacitor has been effectively used as a decoupling capacitor disposed in a high frequency circuit, such as a power supply circuit in a large scale integration (LSI) scheme, or the like. In addition, the multilayer ceramic capacitor has been used as an electromagnetic interference (EMI) filter as well as the decoupling capacitor. In this case, the multilayer ceramic capacitor may have low ESL for high frequency noise removal and reduction.

A smaller pitch between external electrodes maybe more advantageous for decreasing ESL. The reason is that the smaller the pitch between the external electrodes is, the shorter a current path is in the capacitor.

Related Art Document (Patent Document 1) Korean Patent Laid-Open Publication No. 2008-0110180

SUMMARY

An exemplary embodiment in the present disclosure may provide a multilayer ceramic capacitor capable of achieving a reduction in equivalent series inductance (ESL) and preventing the generation of cracks, and a board having the same.

According to an exemplary embodiment in the present disclosure, a multilayer ceramic capacitor may include: a ceramic body including dielectric layers and having first and second main surfaces opposing each other, first and second side surfaces opposing each other, and first and second end surfaces opposing each other; first and second internal electrodes disposed in the ceramic body, in which each first internal electrode is spaced apart from the first and second end surfaces by a predetermined distance and includes first and second lead portions which are spaced apart from each other in a length direction of the ceramic body and exposed to the first main surface, and in which each second internal electrode is spaced apart from the first and second end surfaces by a predetermined distance and includes a third lead portion positioned between the first and second lead portions and exposed to the first main surface; and first to third external electrodes disposed on the first main surface of the ceramic body, the first and second external electrodes being connected to the first internal electrode, and the third external electrode being connected to the second internal electrode, wherein the ceramic body further includes first and second dummy electrodes, each first dummy electrode being disposed on a dielectric layer on which the first internal electrode is disposed and being connected to the third external electrode, and each second dummy electrode being disposed on a dielectric layer on which the second internal electrode is disposed and being connected to at least one of the first and second external electrodes.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
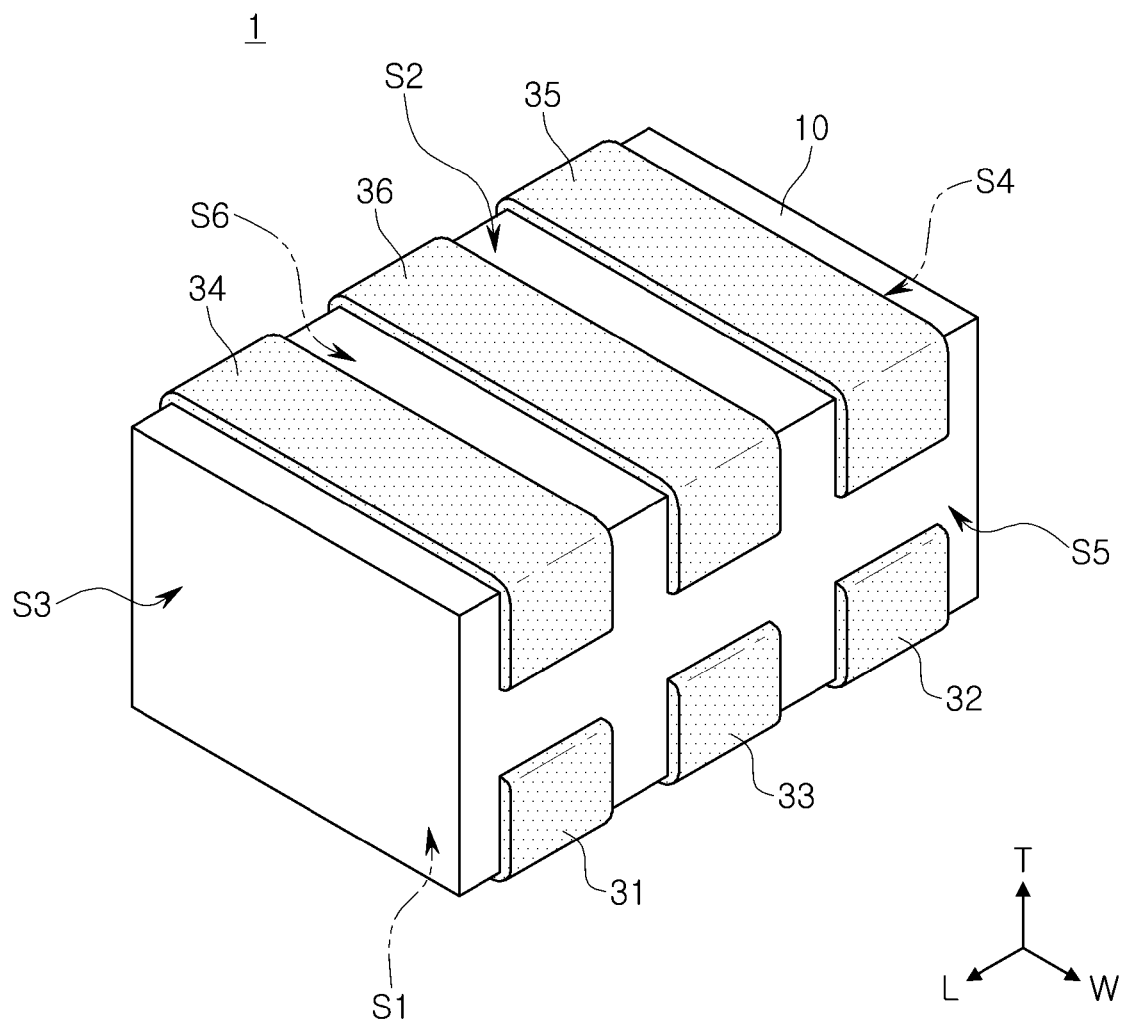
FIG. 1 is a perspective view schematically illustrating a multilayer ceramic capacitor according to an exemplary embodiment in the present disclosure.

Hereinafter, exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Multilayer Ceramic Capacitor

Figure 2:
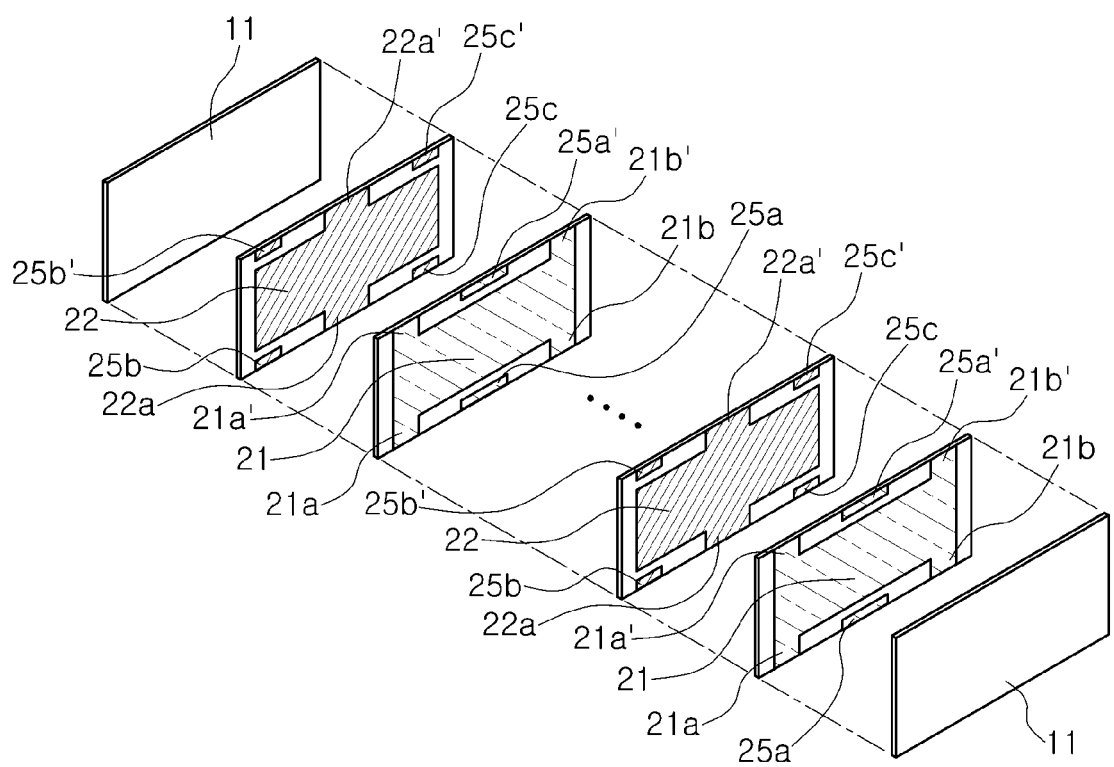
FIG. 2 is an exploded perspective view of a multilayer body of the multilayer ceramic capacitor of FIG. 1.

FIG. 1 is a perspective view illustrating a multilayer ceramic capacitor according to an exemplary embodiment in the present disclosure, and FIG. 2 is an exploded perspective view of a multilayer body of the multilayer ceramic capacitor of FIG. 1.

Referring to FIG. 1, in a multilayer ceramic capacitor 1 according to this exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1.

In the exemplary embodiment, a ceramic body 10 may have first and second main surfaces S1 and S2 opposing each other, first and second side surfaces S5 and S6 opposing each other, and first and second end surfaces S3 and S4 opposing each other.

Referring to FIG. 2, the ceramic body 10 includes dielectric layers 11 and first and second internal electrodes 21 and 22 disposed to face each other with at least one of the dielectric layers 11 interposed therebetween.

A material forming the dielectric layers 11 may be, for example, a barium titanate ($BaTiO_3$) powder, but is not limited thereto as long as sufficient capacitance may be obtained.

The material forming the dielectric layers 11 may further contain various ceramic additives, organic solvents, plasticizers, binders, dispersing agents, or the like, according to intended use, in addition to the powder such as the barium titanate ($BaTiO_3$) powder, or the like.

A thickness of the dielectric layer 11 may be, for example, 3 μm or less, but is not particularly limited thereto.

The first and second internal electrodes 21 and 22 may be alternately stacked with at least one of the dielectric layers 11 interposed therebetween.

The first and second internal electrodes 21 and 22 may include a capacitance portion overlapped with adjacent internal electrodes to contribute to forming capacitance, and a lead portion extended from a portion of the capacitance portion to thereby be led out to the outside of the ceramic body 10.

The lead portion, for example, may have a length shorter than a length of the internal electrode of the capacitance portion in the length (L) direction of the ceramic body 10, but is not limited thereto.

The first internal electrode 21 may have first and second lead portions 21a and 21b spaced apart from each other in the length (L) direction of the ceramic body 10 and exposed to the first main surface S1.

The first internal electrode 21 may further have fourth and fifth lead portions 21a' and 21b' exposed to the second main surface S2 so as to be symmetrical to the first and second lead out portions 21a and 21b exposed to the first main surface S1, respectively, but is not limited thereto.

In addition, the first internal electrode 21 may be spaced apart from the first and second end surfaces S3 and S4 by a predetermined distance.

Meanwhile, the second internal electrode 22 may have a third lead portion 22a positioned between the first and second lead portions 21a and 21b and exposed to the first main surface S1.

The second internal electrode 22 may further have a sixth lead portion 22a' exposed to the second main surface S2 so as to be symmetrical to the third lead portion 22a exposed to the first main surface S1, but is not limited thereto.

In addition, the second internal electrode 22 may be spaced apart from the first and second end surfaces S3 and S4 by a predetermined distance.

A material forming the first and second internal electrodes 21 and 22 is not particularly limited. For example, the first and second internal electrodes 21 and 22 may be formed to contain a conductive metal formed of at least one of a noble metal material such as palladium (Pd), a palladium-silver (Pd—Ag) alloy, or the like, nickel (Ni), and copper (Cu).

In general, in a case in which alternating current (AC) is applied to external electrodes of a multilayer ceramic electronic component which are disposed on end surfaces of a ceramic body opposing each other in a length direction, since a current path is relatively long, a current loop size may be increased, and an intensity of induced magnetic field is increased, resulting in an increase in inductance.

In order to solve this problem, according to the exemplary embodiment of the present disclosure, first to third external electrodes 31 to 33 may be disposed on the first main surface S1 of the ceramic body 10 so as to shorten a current path.

In addition, fourth to sixth external electrodes 34 to 36 maybe further provided on the second main surface S2 opposing the first main surface S1. However, the present disclosure is not limited thereto.

The first to sixth external electrodes 31 to 36 may be extended to portions of the first and second side surfaces S5 and S6 of the ceramic body 10.

In this case, lengths between the first to sixth external electrodes 31 to 36 are reduced. Thus, the current path may be shortened, resulting in a decrease in current loop and inductance.

As described above, the first to sixth external electrodes 31 to 36 may be disposed on the main surfaces S1 and S2 of the ceramic body 10 opposing each other in the thickness (T) direction, and may be electrically connected to the first and second internal electrodes 21 and 22 in order to form capacitance.

The first and second external electrodes 31 and 32 may be connected to the first and second lead portions 21a and 21b of the first internal electrodes 21, respectively, and the third external electrode 33 may be connected to the third lead portions 22a of the second internal electrodes 22.

The fourth and fifth external electrodes 34 and 35 may be connected to the fourth and fifth lead portions 21a' and 21b' of the first internal electrodes 21, respectively, and the sixth external electrode 36 may be connected to the sixth lead portions 22a' of the second internal electrodes 22. However, the present disclosure is not limited thereto.

The first to sixth external electrodes 31 to 36 may be formed of the same conductive material as that of the first and second internal electrodes 21 and 22, but are not limited thereto. For example, the first to sixth external electrodes 31 to 36 may be formed of copper (Cu), silver (Ag), nickel (Ni), or the like.

The first to sixth external electrodes 31 to 36 may be formed by applying a conductive paste prepared by adding a glass frit to a conductive metal powder, and then sintering the applied conductive paste.

Meanwhile, according to the exemplary embodiment of the present disclosure, dummy electrodes may be formed on the dielectric layers on which the first and second internal electrodes 21 and 22 are disposed.

The dummy electrodes do not contact the first and second internal electrodes 21 and 22 and contribute to forming capacitance. In order not to contribute to forming capacitance, the dummy electrodes may not be overlapped with the capacitance portion of the first and second internal electrodes 21 and 22.

The dummy electrodes do not contribute to forming capacitance, but may be exposed outside the ceramic body 10 to thereby prevent the generation of cracks.

A first dummy electrode 25a exposed to the first main surface S1 may be disposed on a dielectric layer on which the first internal electrode 21 is disposed, and a second dummy electrode 25b exposed to the first main surface S1 may be disposed on a dielectric layer on which the second internal electrode 22 is disposed.

A third dummy electrode 25c exposed to the first main surface S1 may be further disposed on the dielectric layer on which the second internal electrode 22 is disposed.

The first dummy electrode 25a may be disposed in a position corresponding to the third lead portion 22a to thereby be connected to the third external electrode 33.

A fourth dummy electrode 25a' exposed to the second main surface S2 may be disposed to be symmetrical to the first dummy electrode 25a exposed to the first main surface S1 to thereby be connected to the sixth external electrode 36. However, the present disclosure is not limited thereto.

The second dummy electrode 25b may be disposed in a position corresponding to the first or second lead portion 21a or 21b to thereby be connected to at least one of the first and second external electrodes 31 and 32.

In the case in which both of the second and third dummy electrodes 25b and 25c are provided, the second and third dummy electrodes 25b and 25c are disposed in positions corresponding to the first and second lead portions 21a and 21b, respectively, to thereby be connected to the first and second external electrodes 31 and 32, respectively.

Fifth and sixth dummy electrodes 25b' and 25c' exposed to the second main surface S2 may be further provided to be symmetrical to the second and third dummy electrodes 25b and 25c exposed to the first main surface S1, respectively, to thereby be connected to the fourth and fifth external electrodes 34 and 35, respectively. However, the present disclosure is not limited thereto.

Figure 3A:
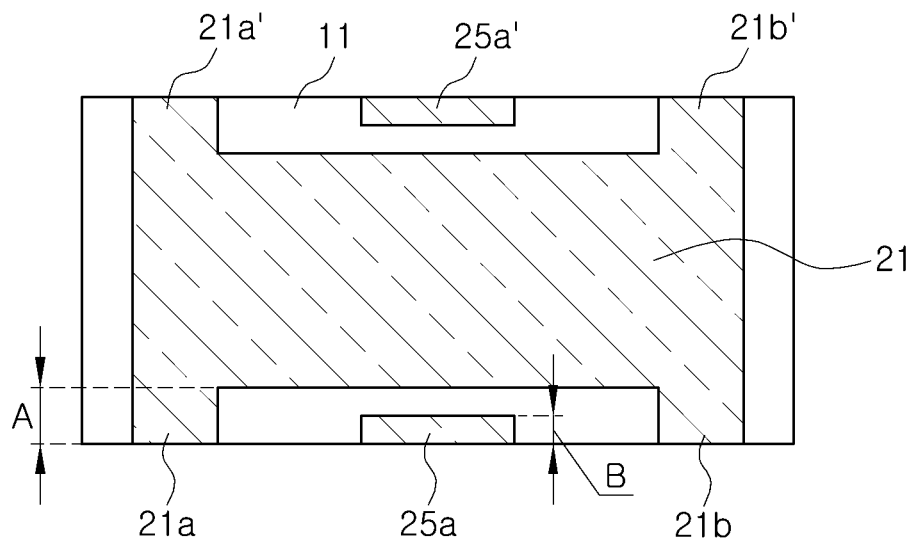
FIGS. 3A and 3B are plan views illustrating first and second internal electrodes and dummy electrodes of the multilayer ceramic capacitor of FIG. 1.
Figure 3B:
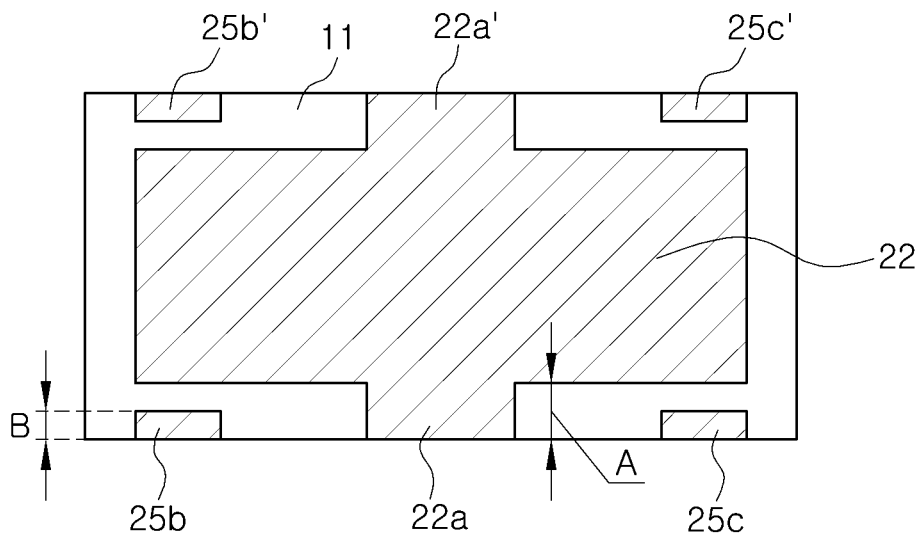

FIGS. 3A and 3B are plan views illustrating the first and second internal electrodes and the dummy electrodes of the multilayer ceramic capacitor of FIG. 1.

Referring to FIG. 3A, in the multilayer ceramic capacitor according to the exemplary embodiment of the present disclosure, when a length of the first lead portion 21a in the thickness (T) direction of the ceramic body 10 is defined as A, and a length of the first dummy electrode 25a in the thickness (T) direction of the ceramic body 10 is defined as B, B/A may satisfy $0.10 \leq B/A \leq 0.81$.

Although A in FIG. 3A denotes the length of the first lead portion 21a in the thickness (T) direction of the ceramic body, A is not limited thereto. That is, a length of the second, fourth, or fifth lead portion 21b, 21a', or 21b' in the thickness (T) direction of the ceramic body may be defined as A.

Further, although B in FIG. 3A denotes the length of the first dummy electrode 25a in the thickness (T) direction of the ceramic body, B is not limited thereto. That is, a length of the fourth dummy electrode 25a' in the thickness (T) direction of the ceramic body may be defined as B.

Referring to FIG. 3B, in the multilayer ceramic capacitor according to the exemplary embodiment of the present disclosure, when a length of the third lead portion 22a in the thickness (T) direction of the ceramic body 10 is defined as A, and a length of the second dummy electrode 25b in the thickness (T) direction of the ceramic body 10 is defined as B, B/A may satisfy $0.10 \leq B/A \leq 0.81$.

Although A in FIG. 3B denotes the length of the third lead portion 22a in the thickness (T) direction of the ceramic body 10, A is not limited thereto. That is, a length of the sixth lead portion 22a' in the thickness (T) direction of the ceramic body 10 may be defined as A.

Further, although B in FIG. 3B denotes the length of the second dummy electrode 25b in the thickness (T) direction of the ceramic body 10, B is not limited thereto. That is, a length of the third, fifth, or sixth dummy electrode 25c, 25b', or 25c' in the thickness (T) direction of the ceramic body 10 may be defined as B.

The generation of cracks may be significantly decreased and the occurrence of short-circuit defects may be prevented by adjusting B/A, which is a ratio of the length of the dummy electrode in the thickness (T) direction of the ceramic body to the length of the lead portion in the thickness (T) direction of the ceramic body, to satisfy $0.10 \leq B/A \leq 0.81$.

Figure 4:
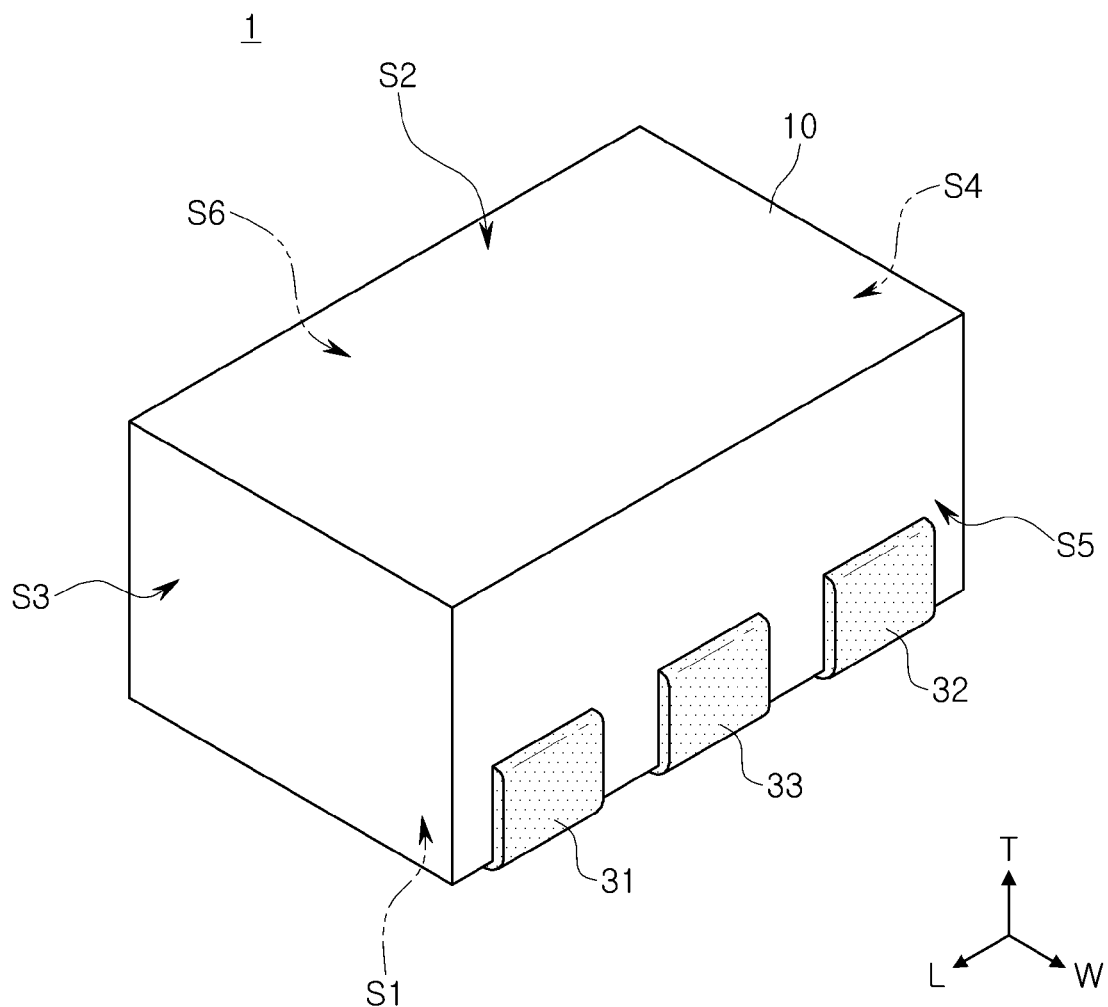
FIG. 4 is a perspective view illustrating a multilayer ceramic capacitor according to another exemplary embodiment in the present disclosure.
Figure 5A:
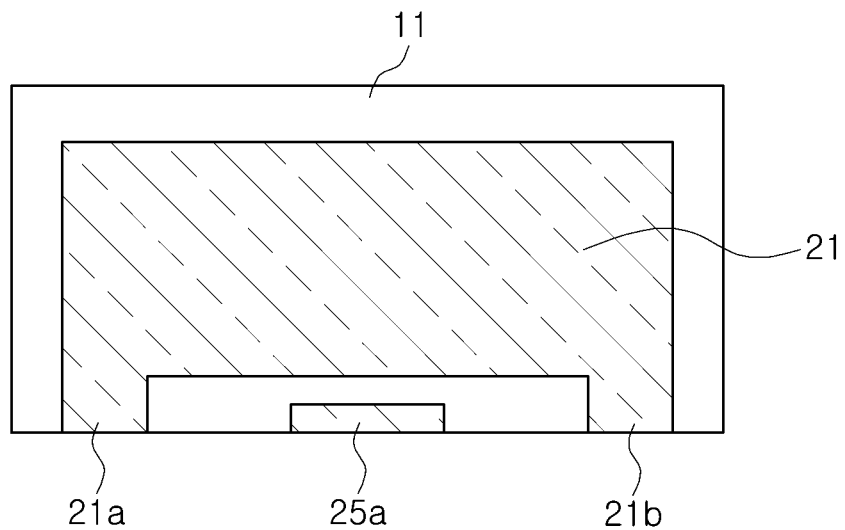
FIGS. 5A and 5B are plan views illustrating first and second internal electrodes and dummy electrodes of the multilayer ceramic capacitor of FIG. 4.
Figure 5B:
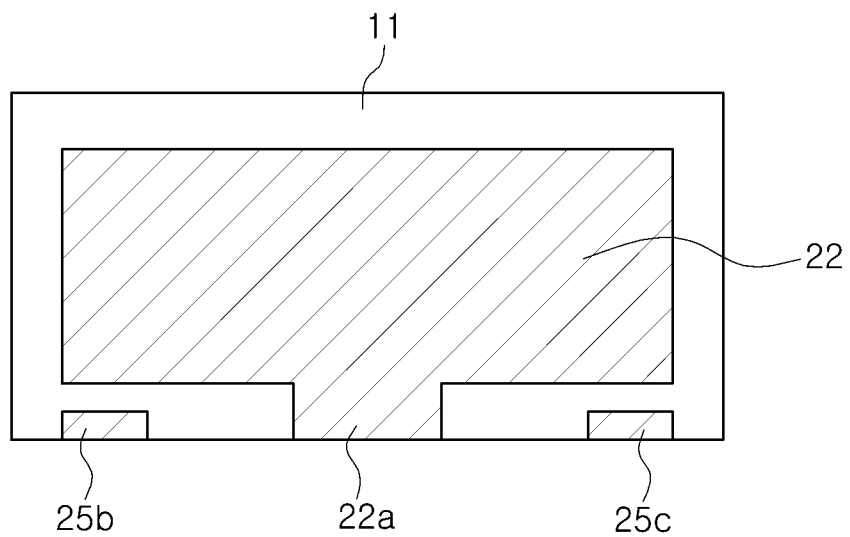

FIG. 4 is a perspective view illustrating a multilayer ceramic capacitor according to another exemplary embodiment of the present disclosure, and FIGS. 5A and 5B are plan views illustrating first and second internal electrodes and dummy electrodes of the multilayer ceramic capacitor of FIG. 4.

Here, since the structure of a ceramic body in the present exemplary embodiment is the same as that of the ceramic body according to the previous exemplary embodiment, a detailed description thereof will be omitted in order to avoid redundancy.

Referring to FIG. 4, first to third external electrodes 31 to 33 may only be disposed on a first main surface S1 of the ceramic body 10. The first to third external electrodes 31 to 33 may be extended to portions of first and second side surfaces S5 and S6 of the ceramic body 10.

Referring to FIG. 5A, a first internal electrode 21 may have first and second lead portions 21a and 21b which are exposed to the first main surface S1, and may be spaced apart from a second main surface S2 by a predetermined distance without lead portions exposed to the second main surface S2.

Further, a first dummy electrode 25a exposed to the first main surface S1 may be provided, but a dummy electrode exposed to the second main surface S2 may not be provided.

Referring to FIG. 5B, a second internal electrode 22 may have a third lead portion 22a which is exposed to the first main surface S1, and may be spaced apart from the second main surface S2 by a predetermined distance without a lead portion exposed to the second main surface S2.

Further, second and third dummy electrodes 25b and 25c exposed to the first main surface S1 may be provided, but dummy electrodes exposed to the second main surface S2 may not be provided.

The first lead portion 21a and the second dummy electrode 25b may be connected to the first external electrode 31, the second lead portion 21b and the third dummy electrode 25c may be connected to the second external electrode 32, and the third lead portion 22a and the first dummy electrode 25a may be connected to the third external electrode 33.

Figure 6:
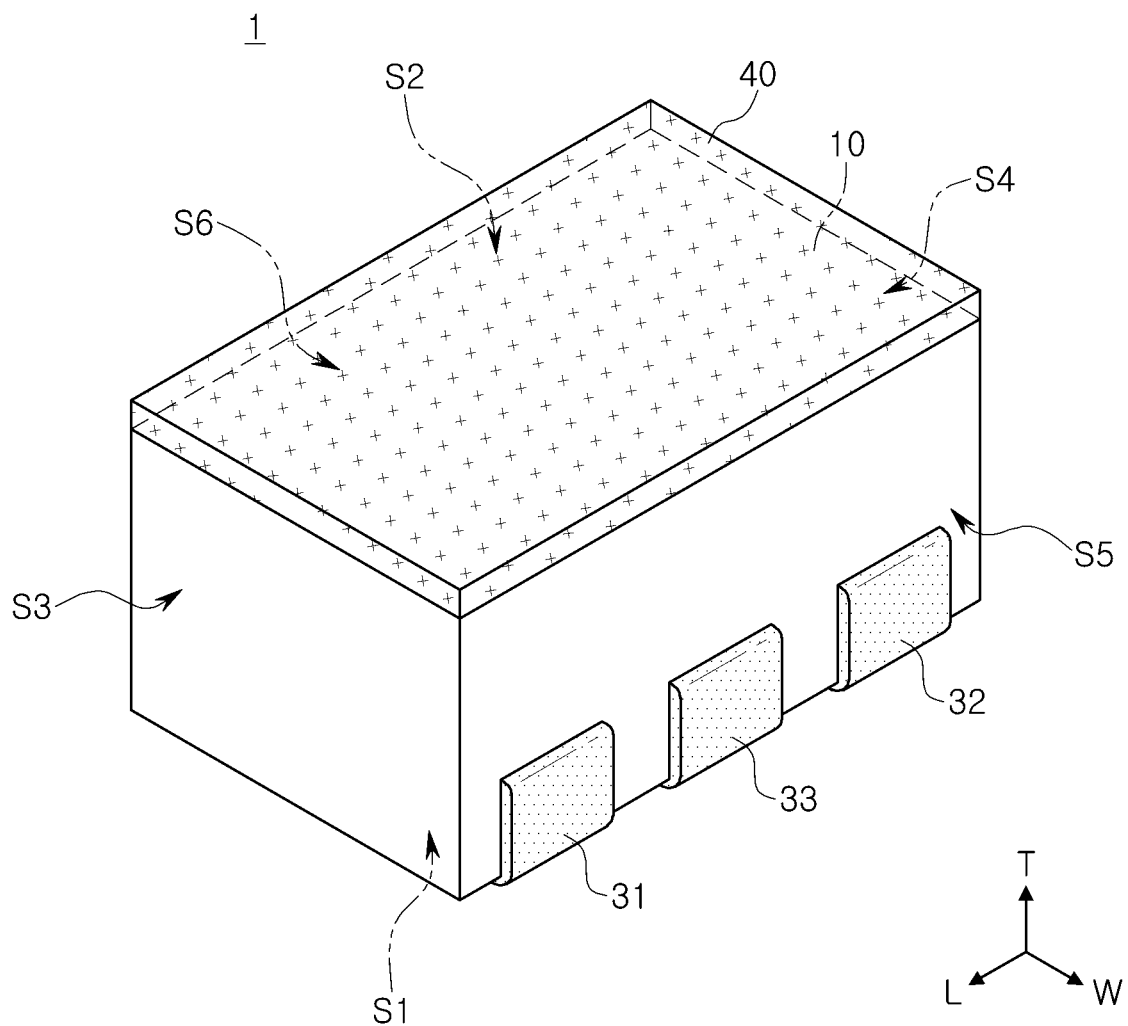
FIG. 6 is a perspective view illustrating a multilayer ceramic capacitor according to another exemplary embodiment in the present disclosure.
Figure 7A:
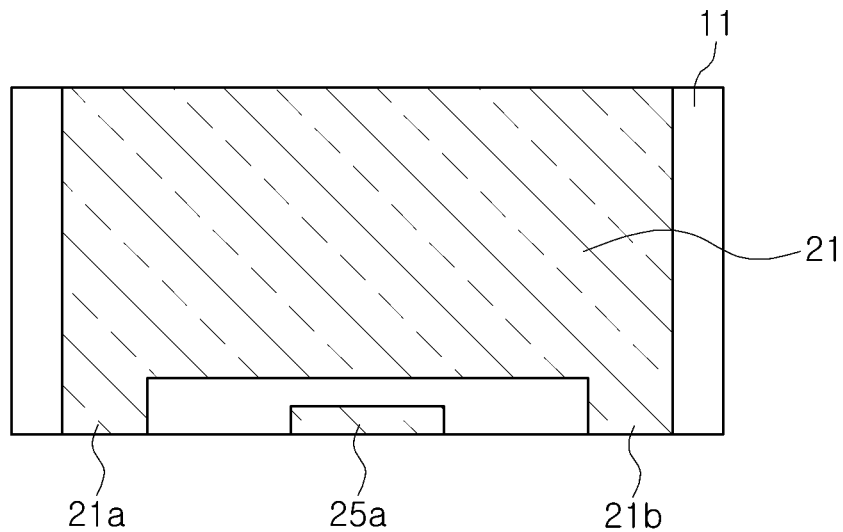
FIGS. 7A and 7B are plan views illustrating first and second internal electrodes and dummy electrodes of the multilayer ceramic capacitor of FIG. 6.
Figure 7B:
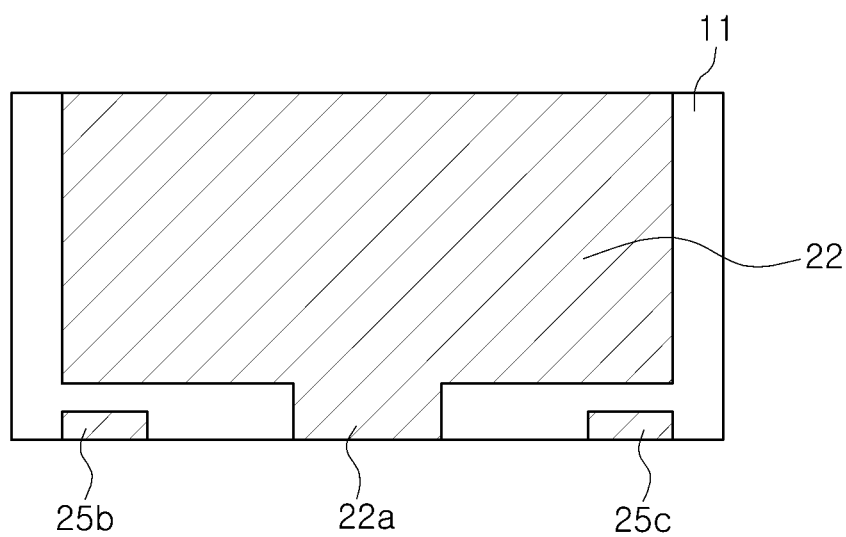

FIG. 6 is a perspective view illustrating a multilayer ceramic capacitor according to another exemplary embodiment of the present disclosure, and FIGS. 7A and 7B are plan views illustrating first and second internal electrodes and dummy electrodes of the multilayer ceramic capacitor of FIG. 6.

Referring to FIG. 6, first to third external electrodes 31 to 33 may only be disposed on a first main surface S1 of a ceramic body 10, and an insulating part 40 may be disposed on a second main surface S2 of the ceramic body 10.

The first to third external electrodes 31 to 33 may be extended to portions of first and second side surfaces S5 and S6 of the ceramic body 10.

Referring to FIG. 7A, a first internal electrode 21 may have first and second lead portions 21a and 21b exposed to the first main surface S1, but does not have lead portions exposed to a second main surface S2, and a capacitance portion of the first internal electrode 21 may be exposed to the second main surface S2.

Further, a first dummy electrode 25a exposed to the first main surface S1 may be provided, but a dummy electrode exposed to the second main surface S2 may not be provided.

Referring to FIG. 7B, a second internal electrode 22 may have a third lead portion 22a exposed to the first main surface S1, but does not have a lead portion exposed to the second main surface S2, and a capacitance portion of the second internal electrode 22 may be exposed to the second main surface S2.

Further, second and third dummy electrodes 25b and 25c exposed to the first main surface S1 may be provided, but dummy electrodes exposed to the second main surface S2 may not be provided.

The first lead portion 21a and the second dummy electrode 25b may be connected to the first external electrode 31, the second lead portion 21b and the third dummy electrode 25c may be connected to the second external electrode 32, and the third lead portion 22a and the first dummy electrode 25a may be connected to the third external electrode 33.

In order to prevent short-circuits, the insulating part 40 may be disposed on the second main surface S2 to which the capacitance portions of the first and second internal electrodes 21 and 22 are exposed.

Figure 8:
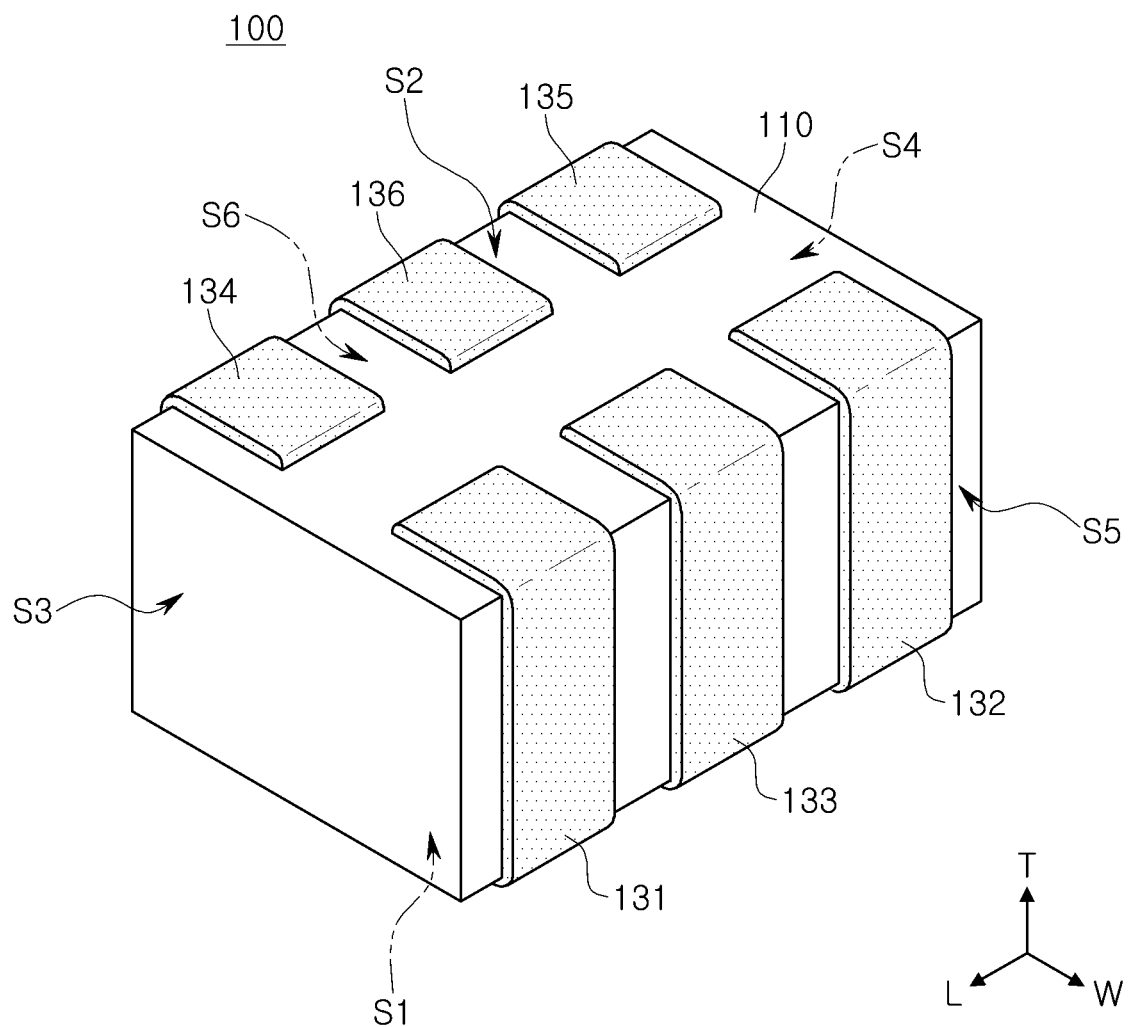
FIG. 8 is a perspective view illustrating a multilayer ceramic capacitor according to another exemplary embodiment in the present disclosure.
Figure 9:
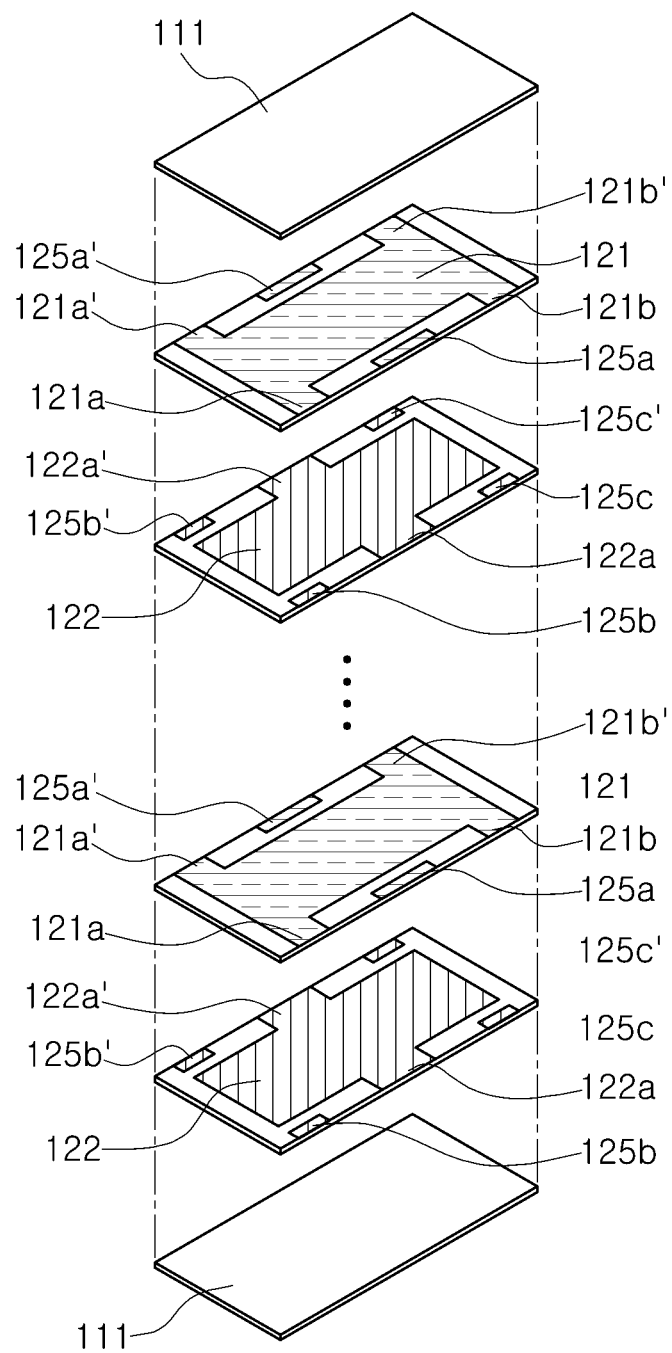
FIG. 9 is an exploded perspective view of a multilayer body of the multilayer ceramic capacitor of FIG. 8.

FIG. 8 is a perspective view illustrating a multilayer ceramic capacitor according to another exemplary embodiment of the present disclosure, and FIG. 9 is an exploded perspective view of a multilayer body of the multilayer ceramic capacitor of FIG. 8.

Referring to FIGS. 8 and 9, according to this exemplary embodiment of present disclosure, there is provided a multilayer ceramic capacitor 100 including a ceramic body 110 including dielectric layers 111 and having first and second main surfaces S1 and S2 opposing each other, first and second side surfaces S5 and S6 opposing each other, and first and second end surfaces S3 and S4 opposing each other; first and second internal electrodes 121 and 122 disposed in the ceramic body 110, in which each first internal electrode 121 is spaced apart from the first and second end surfaces S3 and S4 by a predetermined distance and includes first and second lead portions 121a and 121b which are spaced apart from each other in a length (L) direction of the ceramic body 110 and exposed to the first side surface S5, and fourth and fifth lead portions 121a' and 121b' which are spaced apart from each other in the length (L) direction of the ceramic body 110 and exposed to the second side surface S6, and in which each second internal electrode 122 is spaced apart from the first and second end surfaces S3 and S4 by a predetermined distance and includes a third lead portion 122a positioned between the first and second lead portions 121a and 121b and exposed to the first side surface S5, and a sixth lead portion 122a' positioned between the fourth and fifth lead portions 121a' and 121b' and exposed to the second side surface S6; first to third external electrodes 131 to 133 disposed on the first side surface S5 and connected to the first to third lead portions 121a, 121b, and 122a, respectively; and fourth to sixth external electrodes 134 to 136 disposed on the second side surface S6 and connected to the fourth to sixth lead portions 121a', 121b', and 122a', respectively, wherein the ceramic body further includes first and second dummy electrodes 125a and 125b, each first dummy electrode 125a being disposed on a dielectric layer on which the first internal electrode 121 is disposed and connected to the third external electrode 133, and each second dummy electrode 125b being disposed on a dielectric layer on which the second internal electrode 122 is disposed and connected to at least one of the first and second external electrodes 131 and 132.

Each third dummy electrode 125c may be further disposed on the dielectric layer on which the second internal electrode 122 is disposed.

In the case in which both of the second and third dummy electrodes 125b and 125c are provided, the second and third dummy electrodes 125b and 125c may be disposed in positions corresponding to the first and second lead portions 121a and 121b, respectively, to thereby be connected to the first and second external electrodes 131 and 132, respectively.

The first dummy electrode 125a may be exposed to the first side surface S5, and a fourth dummy electrode 125a' exposed to the second side surface S6 may be further provided to be symmetrical to the first dummy electrode 125a to thereby be connected to the sixth external electrode 136. However, the present disclosure is not limited thereto.

In the case that the second and third dummy electrodes 125b and 125c are exposed to the first side surface S5, fifth and sixth dummy electrodes 125b' and 125c' exposed to the second side surface S6 may be further provided to be symmetrical to the second and third dummy electrodes 125b and 125c, respectively, to thereby be connected to the fourth and fifth external electrodes 134 and 135, respectively. However, the present disclosure is not limited thereto.

The first to sixth external electrodes 131 to 136 may be extended to portions of the first and second main surfaces S1 and S2 of the ceramic body 110.

In the multilayer ceramic capacitor 100 according to this exemplary embodiment of the present disclosure, when a length of the first to sixth lead portions 121a, 121b, 122a, 121a', 121b', and 122a' in a width (W) direction of the ceramic body 110 is defined as A, and a length of the first to sixth dummy electrodes 125a, 125b, 125c, 125a', 125b', and 125c' in the width (W) direction of the ceramic body 110 is defined as B, B/A may satisfy $0.10 \leq B/A \leq 0.81$.

The generation of cracks may be significantly decreased and the occurrence of short-circuit defects may be prevented by adjusting B/A, which is a ratio of the length of the dummy electrode in the width (W) direction of the ceramic body to the length of the lead portion in the width (W) direction of the ceramic body, to satisfy $0.10 \leq B/A \leq 0.81$.

A detailed description of features of the multilayer ceramic capacitor according to this exemplary embodiment of the present disclosure, the same as those of the multilayer ceramic capacitor according to the previous exemplary embodiment of the present disclosure, will be omitted.

The following Table 1 shows results obtained by measuring a crack generation rate and a short-circuit occurrence rate while changing B/A, which is the ratio of the length of the dummy electrode to the length of the lead portion.

TABLE 1

| No. | A (mm) | B (mm) | B/A | Crack Generation Rate (ppm) | Short-Circuit Occurrence Rate (%) |
|---|---|---|---|---|---|
| 1 | 0.135 | 0.000 | 0.000 | 221 | 3.2 |
| 2 | 0.135 | 0.005 | 0.037 | 174 | 3.8 |
| 3 | 0.135 | 0.010 | 0.074 | 148 | 3.9 |
| 4 | 0.135 | 0.015 | 0.111 | 8 | 3.2 |
| 5 | 0.135 | 0.020 | 0.148 | 9 | 3.4 |
| 6 | 0.135 | 0.025 | 0.185 | 8 | 3.6 |
| 7 | 0.135 | 0.030 | 0.222 | 7 | 3.1 |
| 8 | 0.135 | 0.035 | 0.259 | 9 | 4.0 |
| 9 | 0.135 | 0.040 | 0.296 | 5 | 3.6 |
| 10 | 0.135 | 0.045 | 0.333 | 8 | 3.8 |
| 11 | 0.135 | 0.050 | 0.370 | 7 | 3.9 |
| 12 | 0.135 | 0.055 | 0.407 | 5 | 3.2 |
| 13 | 0.135 | 0.060 | 0.444 | 6 | 3.4 |
| 14 | 0.135 | 0.065 | 0.481 | 9 | 3.5 |
| 15 | 0.135 | 0.070 | 0.519 | 7 | 3.7 |
| 16 | 0.135 | 0.075 | 0.556 | 6 | 3.3 |
| 17 | 0.135 | 0.080 | 0.593 | 7 | 3.6 |

TABLE 1-continued

| No. | A (mm) | B (mm) | B/A | Crack Generation Rate (ppm) | Short-Circuit Occurrence Rate (%) |
|---|---|---|---|---|---|
| 18 | 0.135 | 0.085 | 0.630 | 4 | 3.4 |
| 19 | 0.135 | 0.090 | 0.667 | 8 | 3.5 |
| 20 | 0.135 | 0.095 | 0.704 | 5 | 4.1 |
| 21 | 0.135 | 0.100 | 0.741 | 6 | 3.3 |
| 22 | 0.135 | 0.105 | 0.778 | 7 | 3.5 |
| 23 | 0.135 | 0.110 | 0.815 | 8 | 3.4 |
| 24 | 0.135 | 0.115 | 0.852 | 6 | 33.2 |
| 25 | 0.135 | 0.120 | 0.889 | 7 | 48.2 |
| 26 | 0.135 | 0.125 | 0.926 | 8 | 65.6 |
| 27 | 0.135 | 0.130 | 0.963 | 6 | 84.3 |
| 28 | 0.135 | 0.135 | 1.000 | 7 | 100.0 |

Referring to Table 1, it can be seen that in Inventive Examples 4 to 23 in which B/A satisfies 0.10≤B/A≤0.81, the crack generation rate was significantly decreased, and the short-circuit occurrence rate was also low.

Board Having Multilayer Ceramic Capacitor

Figure 10:
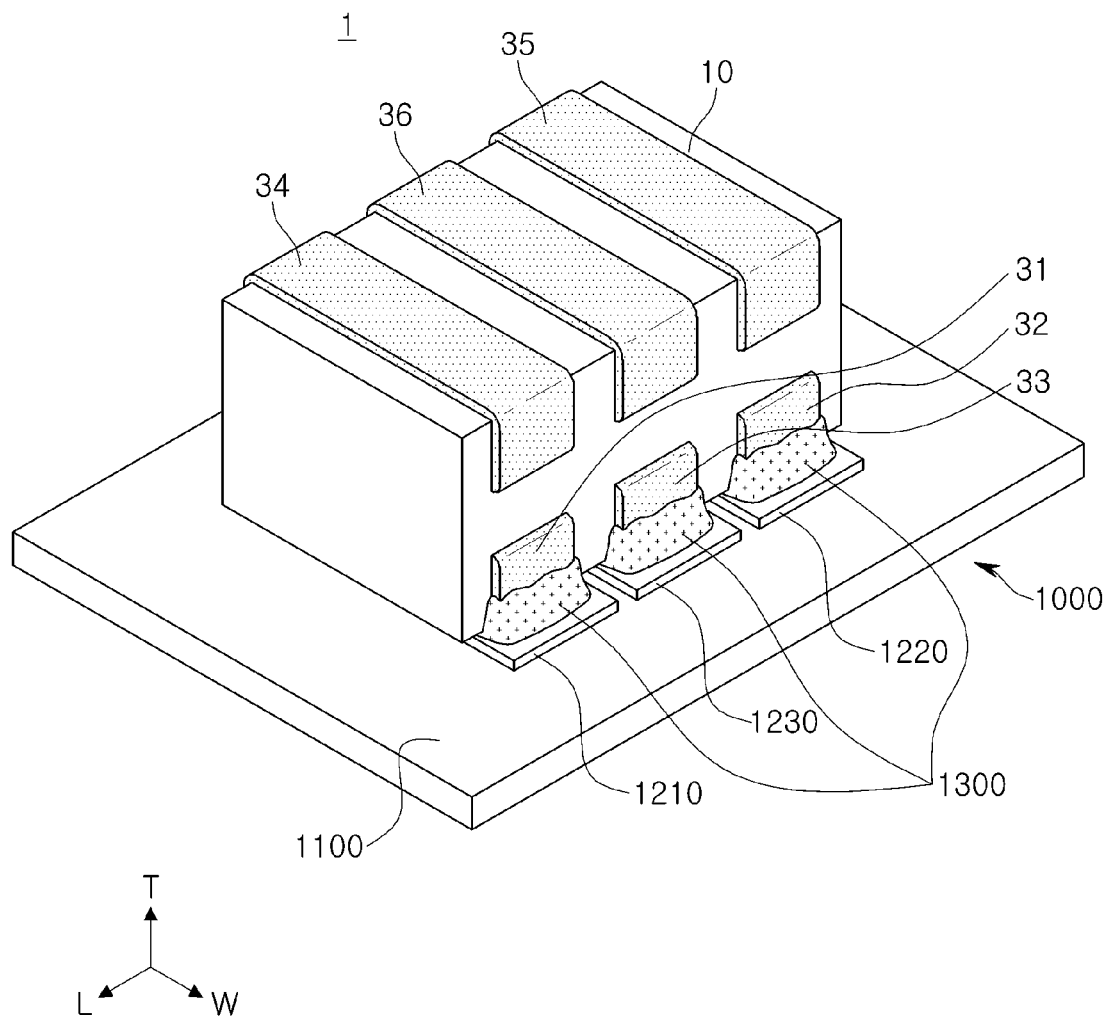
FIG. 10 is a perspective view illustrating a state in which the multilayer ceramic capacitor of FIG. 1 is mounted on a printed circuit board.
Figure 11:
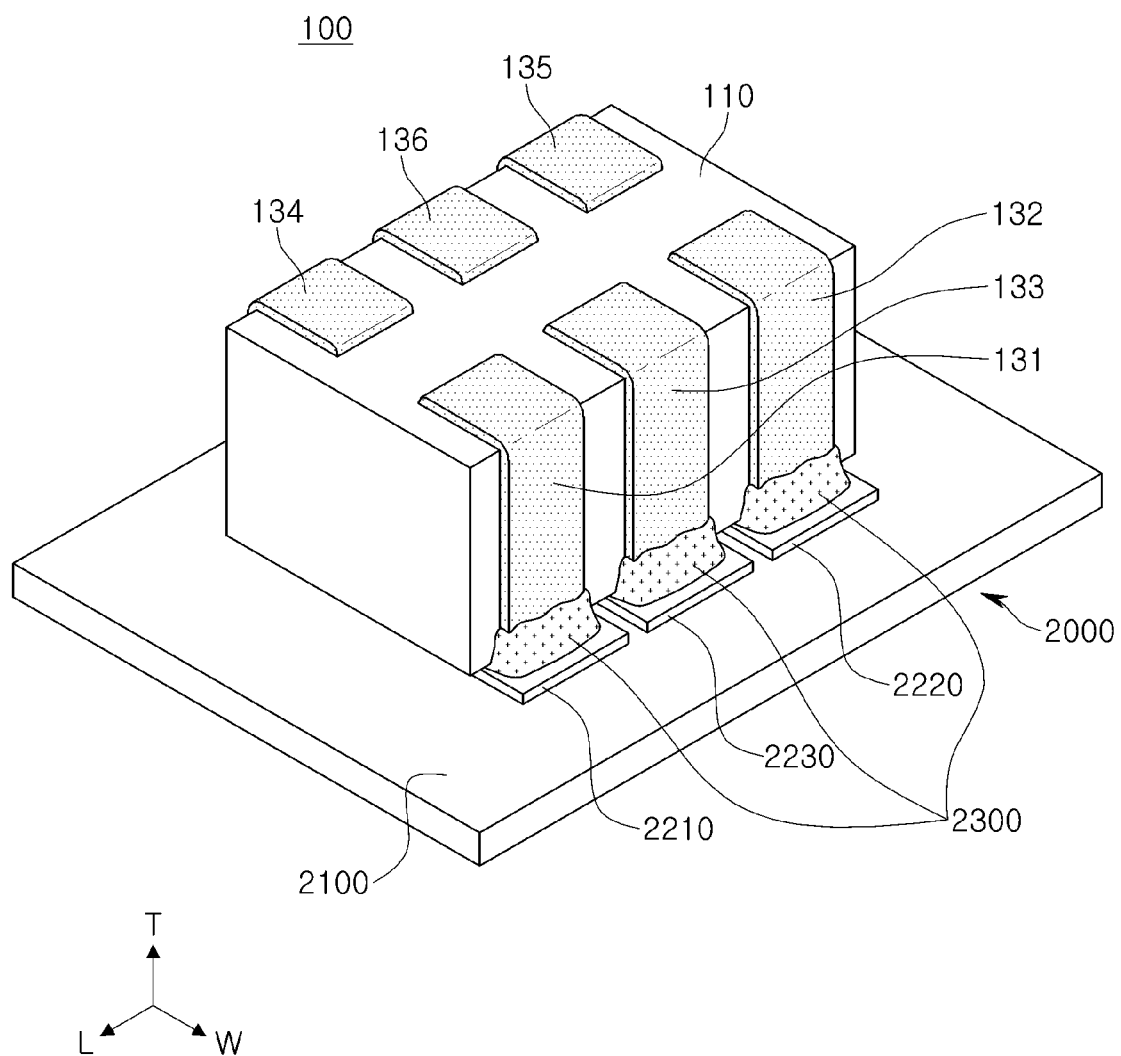
FIG. 11 is a perspective view illustrating a state in which the multilayer ceramic capacitor of FIG. 8 is mounted on a printed circuit board.

FIG. 10 is a perspective view illustrating a state in which the multilayer ceramic capacitor of FIG. 1 is mounted on a printed circuit board; and FIG. 11 is a perspective view illustrating a state in which the multilayer ceramic capacitor of FIG. 8 is mounted on a printed circuit board.

Referring to FIG. 10, a board 1000 having the multilayer ceramic capacitor 1 according to an exemplary embodiment of the present disclosure may include a printed circuit board 1100 on which the multilayer ceramic capacitor 1 is mounted, and first to third electrode pads 1210 to 1230 formed on the printed circuit board 1100 and spaced apart from one another.

In this case, the multilayer ceramic capacitor 1 may be electrically connected to the printed circuit board 1100 by solders 1300 in a state in which the first to third external electrodes 31 to 33 are positioned to contact the first to third electrode pads 1210 to 1230, respectively.

Here, the first and second internal electrodes 21 and 22 of the multilayer ceramic capacitor 1 may be disposed to be perpendicular to the printed circuit board 1100. Accordingly, current may directly flow from the first to third electrode pads 1210 to 1230 of the printed circuit board 1110 to the first and second internal electrodes 21 and 22 through the first to third external electrodes 31 to 33 without a separate current path.

Accordingly, ESL in the multilayer ceramic capacitor mounted on the printed circuit board 1100 may be decreased, and the ESL may be further decreased in accordance with an increase in the number of stacked internal electrodes.

Referring to FIG. 11, a board 2000 having the multilayer ceramic capacitor 100 according to another exemplary embodiment of the present disclosure may include a printed circuit board 2100 on which the multilayer ceramic capacitor 100 is mounted, and first to third electrode pads 2210 to 2230 formed on the printed circuit board 2100 and spaced apart from one another.

In this case, the multilayer ceramic capacitor 100 may be electrically connected to the printed circuit board 2100 by solders 2300 in a state in which the first to sixth external electrodes 131 to 136 are positioned to contact the first to third electrode pads 2210 to 2230, respectively.

Here, the first and second internal electrodes 121 and 122 of the multilayer ceramic capacitor 100 may be disposed to be parallel to the printed circuit board 1100.

Here, in the multilayer ceramic capacitor 100 according to this exemplary embodiment of the present disclosure, since the first to sixth external electrodes 131 to 136 are formed on the first and second side surfaces S5 and S6 of the ceramic body 110 in the width (W) direction thereof, displacement in contraction and expansion may be significantly decreased, whereby acoustic noise may be further decreased.

A detailed description of features of the board according to this exemplary embodiment, the same as those of the board according to the exemplary embodiment of FIG. 10, will be omitted.

As set forth above, in a multilayer ceramic capacitor according to exemplary embodiments of the present disclosure, since a pitch between external electrodes is reduced, low ESL may be obtained. In addition, dummy electrodes may be provided to significantly decrease the generation of cracks.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
a ceramic body including dielectric layers and having first and second main surfaces opposing each other, first and second side surfaces opposing each other, and first and second end surfaces opposing each other;
first and second internal electrodes disposed in the ceramic body, in which the first internal electrode is spaced apart from the first and second end surfaces by a predetermined distance and includes first and second lead portions which are spaced apart from each other in a length direction of the ceramic body and exposed to the first main surface, and in which the second internal electrode is spaced apart from the first and second end surfaces by a predetermined distance and includes a third lead portion positioned between the first and second lead portions and exposed to the first main surface; and
first to third external electrodes disposed on the first main surface of the ceramic body, the first and second external electrodes being connected to the first internal electrode, and the third external electrode being connected to the second internal electrode,
wherein the ceramic body further includes first and second dummy electrodes, the first dummy electrode being disposed on a dielectric layer on which the first internal electrode is disposed and being connected to the third external electrode, and the second dummy electrode being disposed on a dielectric layer on which the second internal electrode is disposed and being connected to at least one of the first and second external electrodes.

2. The multilayer ceramic capacitor of claim 1, further comprising a third dummy electrode disposed on the dielectric layer on which the second internal electrode is disposed, and
wherein the second and third dummy electrodes are connected to the first and second external electrodes, respectively.

3. The multilayer ceramic capacitor of claim 1, wherein the first dummy electrode is disposed in a position corresponding to the third lead portion, and
the second dummy electrode is disposed in a position corresponding to the first or second lead portion.

4. The multilayer ceramic capacitor of claim 1, wherein when a length of the first, second, or third lead portion in a thickness direction of the ceramic body is defined as A, and a length of the first or second dummy electrode in the thickness direction of the ceramic body is defined as B, B/A satisfies 0.10≤B/A≤0.81.

5. The multilayer ceramic capacitor of claim 1, wherein the first and second internal electrodes are spaced apart from the second main surface by a predetermined distance.

6. The multilayer ceramic capacitor of claim 1, wherein capacitance portions of the first and second internal electrodes are exposed to the second main surface, and
an insulating part is disposed on the second main surface.

7. The multilayer ceramic capacitor of claim 1, further comprising:
fourth and fifth lead portions exposed to the second main surface so as to be symmetrical to the first and second lead portions exposed to the first main surface, respectively; and
fourth and fifth external electrodes disposed on the second main surface and connected to the fourth and fifth lead portions, respectively.

8. The multilayer ceramic capacitor of claim 7, further comprising fifth and sixth dummy electrodes disposed on the dielectric layer on which the second internal electrode is disposed, and connected to the fourth and fifth external electrodes, respectively.

9. The multilayer ceramic capacitor of claim 1, further comprising:
a sixth lead portion exposed to the second main surface so as to be symmetrical to the third lead portion exposed to the first main surface; and
a sixth external electrode disposed on the second main surface and connected to the sixth lead portion.

10. The multilayer ceramic capacitor of claim 9, further comprising a fourth dummy electrode disposed on the dielectric layer on which the first internal electrode is disposed, and connected to the sixth external electrode.

11. The multilayer ceramic capacitor of claim 1, wherein the first and second internal electrodes are alternately stacked with at least one of the dielectric layers interposed therebetween.

12. The multilayer ceramic capacitor of claim 1, wherein the first to third external electrodes are extended to portions of the first and second side surfaces.

13. A board having a multilayer ceramic capacitor, the board comprising:
a printed circuit board on which first to third electrode pads are provided; and
the multilayer ceramic capacitor of claim 1, in which the first to third external electrodes are mounted on the first to third electrode pads, respectively.

14. A multilayer ceramic capacitor, comprising:
a ceramic body including dielectric layers and having first and second main surfaces opposing each other, first and second side surfaces opposing each other, and first and second end surfaces opposing each other;
first and second internal electrodes disposed in the ceramic body, in which the first internal electrode is spaced apart from the first and second end surfaces by a predetermined distance, and includes first and second lead portions which are spaced apart from each other in a length direction of the ceramic body and exposed to the first side surface, and fourth and fifth lead portions which are spaced apart from each other in the length direction of the ceramic body and exposed to the second side surface, and in which the second internal electrode is spaced apart from the first and second end surfaces by a predetermined distance, and includes a third lead portion positioned between the first and second lead portions and exposed to the first side surface, and a sixth lead portion positioned between the fourth and fifth lead portions and exposed to the second side surface;
first to third external electrodes disposed on the first side surface and connected to the first to third lead portions, respectively; and
fourth to sixth external electrodes disposed on the second side surface and connected to the fourth to sixth lead portions, respectively,
wherein the ceramic body further includes first and second dummy electrodes, the first dummy electrode being disposed on a dielectric layer on which the first internal electrode is disposed and being connected to the third external electrode, and the second dummy electrode being disposed on a dielectric layer on which the second internal electrode is disposed and being connected to at least one of the first and second external electrodes.

15. The multilayer ceramic capacitor of claim 14, further comprising a third dummy electrode disposed on the dielectric layer on which the second internal electrode is disposed,
wherein the second and third dummy electrodes are connected to the first and second external electrodes, respectively.

16. The multilayer ceramic capacitor of claim 14, wherein when a length of the first, second, or third lead portion in a width direction of the ceramic body is defined as A, and a length of the first or second dummy electrode in the width direction of the ceramic body is defined as B, B/A satisfies $0.10 \leq B/A \leq 0.81$.

17. The multilayer ceramic capacitor of claim 14, further comprising fourth dummy electrodes each disposed on the dielectric layer on which the first internal electrode is disposed, and connected to the sixth external electrode.

18. The multilayer ceramic capacitor of claim 14, further comprising fifth and sixth dummy electrodes disposed on the dielectric layer on which the second internal electrode is disposed, and connected to the fourth and fifth external electrodes, respectively.

* * * * *